United States Patent
Rose et al.

(10) Patent No.: US 10,986,423 B2
(45) Date of Patent: Apr. 20, 2021

(54) NETWORK DEVICE WITH COMPACT CHASSIS

(71) Applicant: Arista Networks, Inc., Santa Clara, CA (US)

(72) Inventors: Alex Rose, Santa Clara, CA (US); Daniel Kim, Santa Clara, CA (US); Robert Wilcox, Saratoga, CA (US); Richard Hibbs, Santa Clara, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 0 days.

(21) Appl. No.: 16/381,077

(22) Filed: Apr. 11, 2019

(65) Prior Publication Data

US 2020/0329286 A1  Oct. 15, 2020

(51) Int. Cl.
| | |
|---|---|
| *H04Q 1/04* | (2006.01) |
| *H04Q 1/02* | (2006.01) |
| *H05K 7/20* | (2006.01) |
| *H05K 7/18* | (2006.01) |

(52) U.S. Cl.
CPC .............. *H04Q 1/04* (2013.01); *H04Q 1/03* (2013.01); *H05K 7/186* (2013.01); *H05K 7/20545* (2013.01); *H05K 7/20572* (2013.01)

(58) Field of Classification Search
CPC .. H05K 7/1487; H05K 7/186; H05K 7/20145; H05K 7/20545–20572; H05K 7/20718–20736; H04Q 1/03–068; H04Q 1/145; G06F 1/30–3006
USPC .............. 361/679.49–679.51, 695, 724–727; 454/184–186, 133; 165/59
See application file for complete search history.

(56) References Cited

U.S. PATENT DOCUMENTS

| | | | |
|---|---|---|---|
| 3,697,927 A | 10/1972 | Kunkle et al. | |
| 3,715,629 A | 2/1973 | Swengel | |
| 5,296,748 A | 3/1994 | Wicklund et al. | |
| 5,887,158 A | 3/1999 | Sample | |
| 5,943,490 A | 8/1999 | Sample | |
| 5,960,191 A | 9/1999 | Sample et al. | |
| 6,163,464 A | 12/2000 | Ishibashi et al. | |
| 6,168,469 B1 | 1/2001 | Lu | |
| 6,466,008 B1 | 10/2002 | Fung et al. | |

(Continued)

OTHER PUBLICATIONS

PCT Application PCT/US2018/047588 filed Aug. 22, 2018, Written Opinion dated Dec. 6, 2018, 7 pages.

(Continued)

*Primary Examiner* — Zachary Pape
*Assistant Examiner* — Amir A Jalali
(74) *Attorney, Agent, or Firm* — Fountainhead Law Group P.C.

(57) ABSTRACT

In some implementations, a network device is provided. The network device includes a housing and a set of switch cards, mounted within the housing. The set of switch cards includes a first set of connectors. The network device also includes a set of line cards having a second set of connectors. The set of line cards are oriented parallel to each other and oriented orthogonally to the set of switch cards. The second set of connectors is coupled to the first set of connectors to couple the set of switch cards to the set of line cards. The network device further includes a first set of power supplies disposed along a left side of the housing and a second set of power supplies disposed along a right side of the housing.

20 Claims, 6 Drawing Sheets

(56) References Cited

U.S. PATENT DOCUMENTS

| | | |
|---|---|---|
| 6,538,899 B1 | 3/2003 | Krishnamurthi et al. |
| 6,694,464 B1 | 2/2004 | Quayle et al. |
| 6,704,307 B1 | 3/2004 | Graves et al. |
| 6,757,748 B1 | 6/2004 | Hipp |
| 6,795,885 B1 | 9/2004 | deBlanc et al. |
| 6,932,649 B1 | 8/2005 | Rothermel et al. |
| 6,997,736 B2 | 2/2006 | Costello et al. |
| 7,388,757 B2 | 6/2008 | Moakes et al. |
| 7,764,511 B2 | 7/2010 | Lee et al. |
| 7,885,066 B2 | 2/2011 | Boyden et al. |
| 7,929,310 B2 | 4/2011 | Belady et al. |
| 8,208,253 B1 * | 6/2012 | Goergen ............... H05K 7/1445 342/175 |
| 8,267,699 B2 | 9/2012 | Li |
| 8,500,454 B2 | 8/2013 | Hirano et al. |
| 8,579,636 B2 | 11/2013 | Davis et al. |
| 8,842,441 B2 | 9/2014 | Bai et al. |
| 8,861,222 B2 | 10/2014 | Wen et al. |
| 9,116,660 B1 | 8/2015 | Widmann et al. |
| 9,136,624 B1 | 9/2015 | Reynov et al. |
| 9,362,641 B2 | 6/2016 | Bachmutsky |
| 9,559,446 B1 | 1/2017 | Wetzel et al. |
| 9,582,057 B2 * | 2/2017 | Hartman ................ G06F 1/30 361/728 |
| 9,794,195 B1 | 10/2017 | Wilson et al. |
| 9,888,605 B2 | 2/2018 | Xu et al. |
| 9,904,336 B1 * | 2/2018 | Khan ................ H05K 7/20172 |
| 10,225,953 B2 | 3/2019 | Gernert |
| 2001/0046794 A1 * | 11/2001 | Edholm ............. H01R 12/7005 439/61 |
| 2002/0046878 A1 | 4/2002 | Uzuka et al. |
| 2002/0182899 A1 | 12/2002 | Debord et al. |
| 2003/0200330 A1 | 10/2003 | Oelke et al. |
| 2004/0221106 A1 | 11/2004 | Perego et al. |
| 2005/0047098 A1 | 3/2005 | Garnett et al. |
| 2005/0207134 A1 | 9/2005 | Belady et al. |
| 2006/0073709 A1 | 4/2006 | Reid |
| 2006/0187634 A1 | 8/2006 | Tanaka et al. |
| 2006/0264085 A1 | 11/2006 | Kwatra et al. |
| 2007/0232089 A1 | 10/2007 | Fung |
| 2008/0112133 A1 | 5/2008 | Torudbakken et al. |
| 2008/0112152 A1 | 5/2008 | Figueroa et al. |
| 2009/0009960 A1 | 1/2009 | Melanson et al. |
| 2009/0016019 A1 * | 1/2009 | Bandholz ................ G06F 1/20 361/695 |
| 2009/0149041 A1 | 6/2009 | Morlion et al. |
| 2009/0216920 A1 | 8/2009 | Lauterbach et al. |
| 2010/0014248 A1 | 1/2010 | Boyden et al. |
| 2011/0002108 A1 * | 1/2011 | Dahlfort ................ H04Q 1/035 361/796 |
| 2011/0210123 A1 | 9/2011 | Lin et al. |
| 2012/0120596 A1 | 5/2012 | Bechtolsheim |
| 2012/0294314 A1 | 11/2012 | Campbell et al. |
| 2013/0151745 A1 | 6/2013 | Yin et al. |
| 2013/0215563 A1 | 8/2013 | Behziz et al. |
| 2013/0337665 A1 | 12/2013 | Cohen et al. |
| 2014/0133091 A1 * | 5/2014 | Shah .................... H05K 7/1488 361/679.48 |
| 2014/0220795 A1 | 8/2014 | Bai et al. |
| 2014/0293998 A1 | 10/2014 | Cheung et al. |
| 2015/0036280 A1 | 2/2015 | Gektin et al. |
| 2015/0162680 A1 | 6/2015 | Costello et al. |
| 2015/0186319 A1 | 7/2015 | Blevins et al. |
| 2015/0280827 A1 | 10/2015 | Adiletta et al. |
| 2015/0289406 A1 | 10/2015 | Coteus et al. |
| 2016/0183402 A1 | 6/2016 | Tamarakin et al. |
| 2017/0017052 A1 | 1/2017 | Costello |
| 2017/0269871 A1 * | 9/2017 | Khan .................... G06F 3/0673 |
| 2017/0359923 A1 * | 12/2017 | Franz ................ H05K 7/20254 |
| 2018/0359194 A1 | 12/2018 | Yang |
| 2019/0104632 A1 * | 4/2019 | Nelson ................ G06F 1/183 |
| 2019/0207342 A1 | 7/2019 | Aden et al. |
| 2019/0307014 A1 | 10/2019 | Adiletta et al. |
| 2020/0036058 A1 * | 1/2020 | van Lammeren .... G01R 31/389 |
| 2020/0195583 A1 | 6/2020 | Ramalingam et al. |
| 2020/0195586 A1 | 6/2020 | Weaver |

OTHER PUBLICATIONS

U.S. Appl. No. 16/575,171, filed Sep. 18, 2019 (unpublished), 47 pages.

* cited by examiner

NETWORK DEVICE WITH COMPACT CHASSIS

BACKGROUND

A network device, such as a network switch, may have multiple line cards, and each line card can have multiple ports or interfaces. Multiple switch cards each containing one or more switch chips or circuits for connecting the line cards are common in such network devices. The network devices are often installed on or attached to racks (e.g., rack frames, rack mounts, etc.).

SUMMARY

In some implementations, a network device is provided. The network device includes a housing and a set of switch cards, mounted within the housing. The set of switch cards includes a first set of connectors. The network device also includes a set of line cards having a second set of connectors. The set of line cards are oriented parallel to each other and oriented orthogonal to the set of switch cards. The second set of connectors is coupled to the first set of connectors to couple the set of switch cards to the set of line cards. The network device further includes a first set of power supplies disposed along a left side of the housing and a second set of power supplies disposed along a right side of the housing.

In some embodiments, a method of manufacturing a network device is provided. The method includes obtaining a first set of power supplies, a second set of power supplies, a set of line cards, and a set of switch cards. The method also includes installing, within a housing, the first set of power supplies along a side of the housing. The method further includes installing, within the housing, the second set of power supplies along an opposing side of the housing. The method further includes installing, within the housing, the set of switch cards between the first set of power supplies and the second set of power supplies, wherein the set of switch cards is oriented parallel to each other. The method further includes installing, within the housing, the set of line cards in front of the first set of power supplies, the second set of power supplies, and the set of switch cards. The set of line cards are oriented orthogonally to the set of switch cards. The set of line cards are oriented parallel with each other.

In some implementations, a network device is provided. The network device includes a housing and a set of switch cards, mounted within the housing and having a first set of connectors. The network device also includes a set of line cards comprising a second set of connectors. The set of line cards are oriented parallel to each other and oriented orthogonally to the set of switch cards. The second set of connectors is coupled to the first set of connectors to couple the set of switch cards to the set of line cards. The network device further includes a first set of power supplies disposed along a first side of the housing and a second set of power supplies disposed along a second, opposing side of the housing. The network device further includes a busbar coupled to the set of line cards, the set of switch cards, the first set of power supplies, and the second set of power supplies.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Various embodiments of a network switch device described herein have multiple line cards mounted orthogonally to and electrically coupled to multiple switch cards. Power supplies for the network device may be installed such that the power supplies are in-line with the line cards (e.g., behind the line cards). A busbar located in between the line cards, and the power supplies and switch cards, allowing the busbar to deliver power to components of the network device from a central location. Installing the power supplies in-line with the network cards may allow the height of the network device to be reduced while allowing for enough air to flow through the network device to cool the components of the network device (e.g., line cards, supervisor cards, switch cards, power supplies, etc.).

Figure 1:
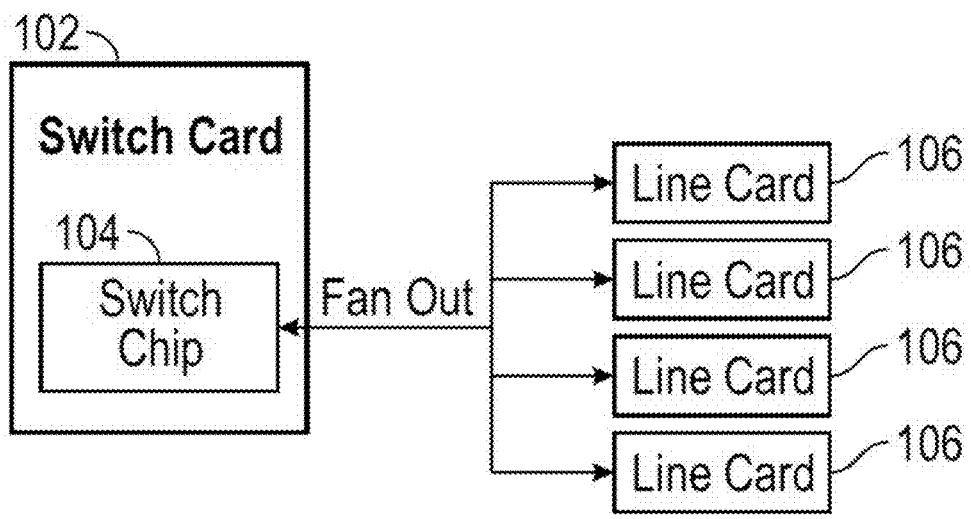
FIG. 1 is a block diagram illustrating an example of a switch card, in accordance with some embodiments of the present disclosure.

FIG. 1 is a block diagram illustrating an example switch card 102, in accordance with some embodiments of the present disclosure. Switch card 102 includes switch chip 104 that fans out to multiple line cards 106. Switch card 102 and line cards 106 may be included in a network device, such as a network switch. Switch card 102 may be referred to as a fabric card, a fabric switch card, etc. The switches within switch chip 104 may be referred to as switching paths or routing paths. These switching paths or routing paths couple and/or connect ingress and egress ports of switch chip 104 through the switch fabric in some embodiments.

Figure 2:
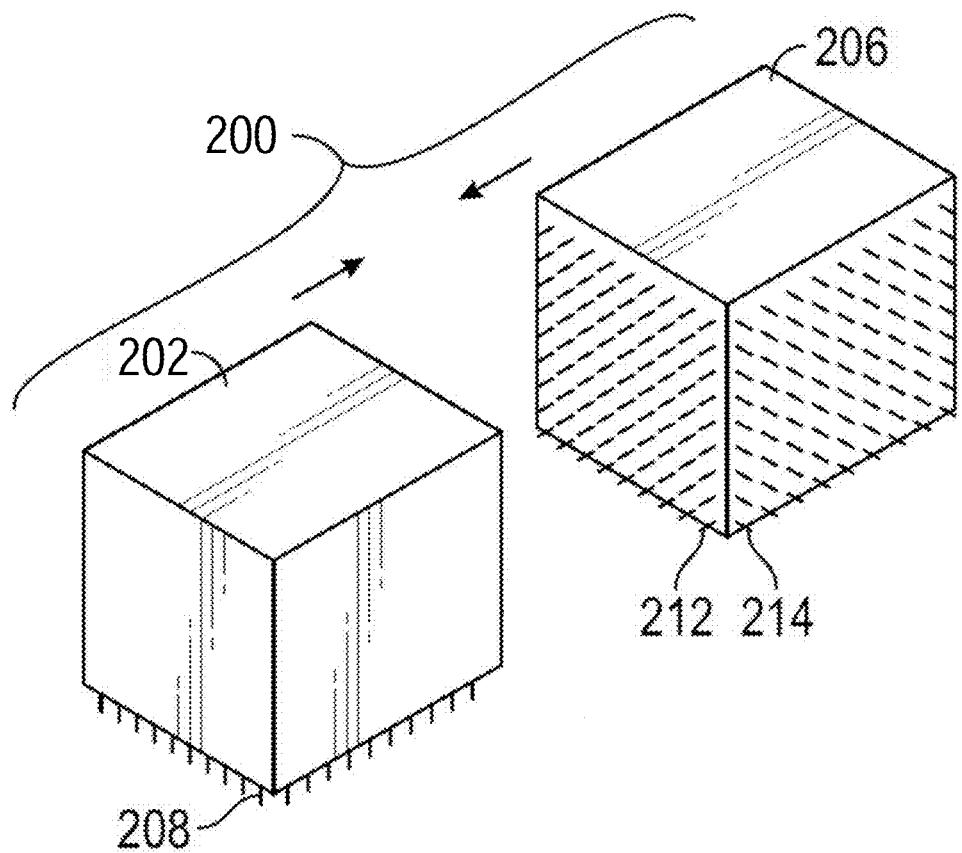
FIG. 2 is a diagram illustrating a perspective view of an example orthogonal connector, in accordance with some embodiments of the present disclosure.
Figure 3:
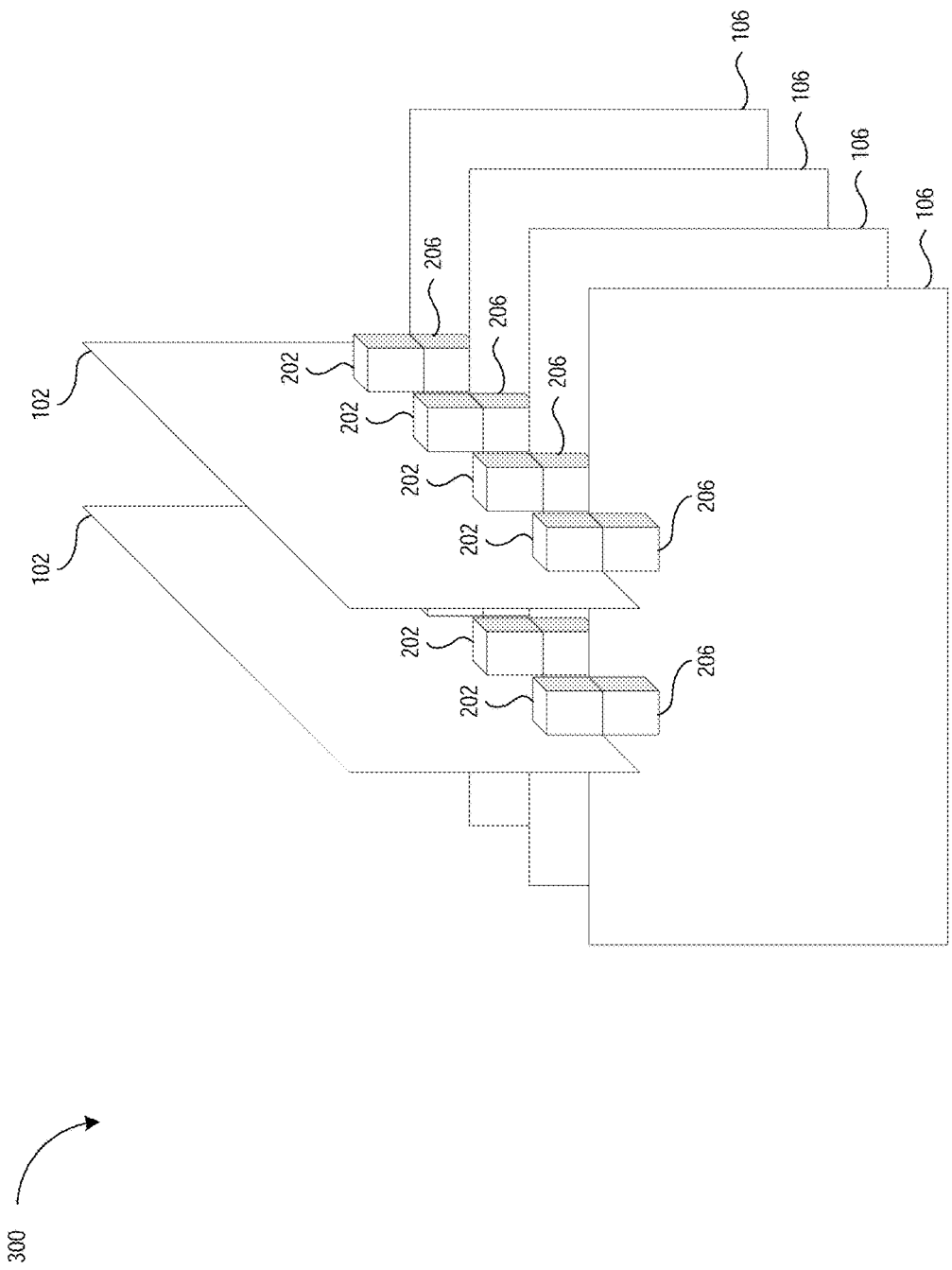
FIG. 3 is a diagram illustrating an example network device, in accordance with some embodiments of the present disclosure.

FIG. 2 is a diagram illustrating a perspective view of an example orthogonal connector 200, in accordance with some embodiments of the present disclosure. Various orthogonal connectors are available from vendors, with various numbers of conductors, dimensions and relative orientations, and embodiments are not limited to the specific connectors shown herein. In this version, pins 212 of one connector 206 (e.g., a male connector) are inserted into sockets or pin receptacles of another connector 202 (e.g., a female connector), with solder pins 214 of connector 206 perpendicular or orthogonal to the solder pins 208 of the other connector 202. Inserting \ pins 212 of connector 206 into sockets/receptacles of connector 202 mates the two connectors 202, 206 of the orthogonal connector 200. Solder pins 208 and 214 may be soldered (or otherwise coupled to) to a printed circuit board (PCB). Orthogonal connectors may have a specific handedness or orientation of orthogonality (e.g., as keyed), or may have one connector rotatable with respect to the other connector. It should be appreciated that the mating or engagement of connectors 202 and 206 may utilize any suitable orientation that results in the orthogonal orientation discussed herein. When a printed circuit board or card is assembled to one connector 206 and another printed circuit board or card is assembled to other connector 202, and the connectors 202, 206 are assembled to each other (i.e., mated) as orthogonal connector 200, the two printed circuit boards or cards are orthogonal to each other as shown in FIG. 3. Note that two such printed circuit boards would meet each other edge to edge, in an embodiment, with the edge of one printed circuit board adjacent and perpendicular to the edge of the other printed circuit board, rather than edge to face as is the case with orthogonal board connectors, e.g., that position one printed circuit board perpendicular and coupled to a central region of a face of another printed circuit board. Network devices, such as network may be implemented more efficiently using the orthogonal arrangement of line cards 106 and switch cards 102, as illustrated in FIG. 3. This may reduce trace routing and/or signal loss and may allow for more airflow through the network device, as discussed in more detail below.

Connector 202 may be part of a switch card and connector 206 may be part of a line card. Connector 202 may be referred to as a switch card connector and connector 206 may be referred to a line card connector. In some embodiments, connector 202 may be part of a supervisor card (e.g., supervisor card 410 illustrated in FIG. 4). Line cards, switch cards, and supervisor cards are discussed in more detail below.

The term "connector" is understood to apply to a large variety of connectors with a large variety of numbers of conductors, and to groups of connectors, individual connectors, and components of a connector. For example, a male plug having one or more pins or prongs is considered a connector, a female socket having one or more pin or prong receptacles or socket contacts is considered a connector, and the combination of a male plug and female socket is a connector, as are hermaphrodite connectors and their components. Groups of multiple male connectors are considered a connector, as are groups of female connectors, and groups of hermaphrodite connectors. Connections to a connector can be made for example by crimping, soldering (pins or surface mount), or fastening, and can be made by wires, printed circuit board pads, plated through holes, edges or traces, or other connectors among various possibilities. Other types of pins, pads, wires, traces, etc., may be used in other embodiments. For example, press fit pins may be used to couple a connector to a printed circuit board.

FIG. 3 is a diagram illustrating an example network device 300, in accordance with some embodiments of the present disclosure. The network device 300 includes multiple line cards 106 coupled through orthogonal connectors 202, 206 (i.e., orthogonal connectors 200) to multiple switch cards 102. Circuits and signals of each line card 106 are coupled to the switch chips of the switch cards 102 through the connectors 202, 206, which orient the line cards 106 parallel to each other and orthogonal to the switch cards 102. One edge of each line card 106 meets with (i.e., is adjacent to), and is perpendicular to, one edge of the switch cards 102. In some embodiments, each connector 202, 206 is a single component, and in other embodiments, connectors 202 are combined into one connector, and/or connectors 206 are combined into one connector. Collectively, the combination of connectors 202, 206 in various embodiments can be viewed as a connector, or multiple connectors. Line cards 106 may include hardware, software, firmware, or a combination thereof to connect to external user equipment. Switch cards 102 may provide connections between line cards 106 (e.g., may interconnect the line cards 106).

Network devices, such as network device 300 may be implemented more efficiently using the orthogonal arrangement of line cards 106 and switch cards 102, as illustrated in FIG. 3. For example, in the orthogonal arrangement/configuration illustrated in FIG. 3, each switch card 102 is coupled to each line card 106 at the points where the line and fabric cards cross. This may reduce trace routing and/or signal loss that is associated with general/traditional backplane implementation. In addition, the orthogonal arrangement/configuration illustrated in FIG. 3 may allow for more airflow through the network device 300 which may help decrease the temperature within network device 300 (e.g., may increase the cooling of the network device 300, may decrease the temperature of components of the switch cards 102 and the line cards 106). Although two switch cards 102 and four line cards 106 are illustrated in FIG. 3, any number of line cards and/or switch cards may be used in network device 300, in other embodiments. In some embodiments, network device 300 may also include one or more supervisor cards. For example, one or more of line cards 106 may be replaced with a supervisor card.

As discussed above, network device 300 may be installed on or attached to racks (e.g., rack mounts, rack frames, etc.). Generally, racks have a fixed and/or standardized size. For example, a rack may have a certain height. The height of the racks may limit the number of network devices that may be mounted to the racks. For example, if a rack has a height of 20 feet, and each network device has a height of 2 feet, then 10 network devices may be installed in the rack. It may be desirable to install more network devices on a rack to reduce the number of racks used to house the network devices. For example, installing more devices on a rack may reduce the number of racks that are used, which may reduce the space used by the racks (e.g., space within a data center). Thus, it may be useful to be able to install more network devices in existing racks.

Figure 4:
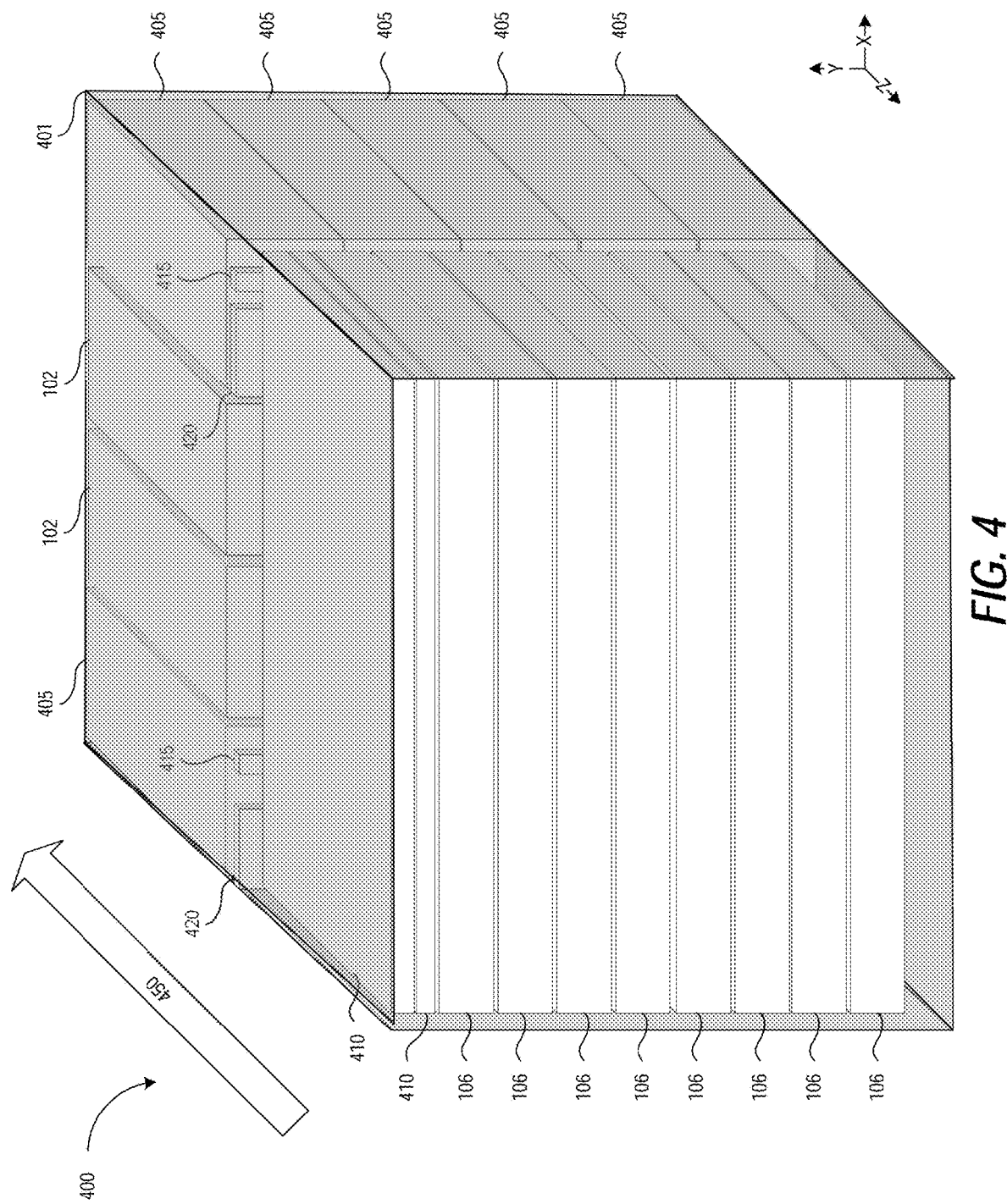
FIG. 4 is a diagram illustrating a perspective view of an example network device, in accordance with some embodiments of the present disclosure.

FIG. 4 is a diagram illustrating a perspective view (e.g., an isometric view) of an example network device 400, in accordance with some embodiments of the present disclosure. As discussed above, a network device may be a device that communicates (e.g., transmits, sends, receives, forwards, etc.) data (e.g., packets, frames, message, etc.) with a network or with other devices (e.g., other computing devices, other network devices, etc.). For example, a network device may be a switch, router, hub, bridge, gateway, etc., or any type of device that can communicate data packets with a network. In other embodiments, the network device may comprise a virtual machine and/or a container (e.g., a virtual environment).

As illustrated in FIG. 4, the network device 400 includes housing 401. Housing 401 may also be referred to as a chassis. Housing 401 may be a frame, body, cage, structure, framework, etc., in which the components of network device 400 may be located. For example, one or more of line cards 106, switch cards 106, power supplies 405, printed circuit board assemblies (PCBAs) 420, busbar 415, the connectors, etc., may be located in housing 401.

Network device 400 includes a set of switch cards 102 (e.g., two switch cards). Although two switch cards 102 are illustrated, other embodiments may use any number of switch cards 102 (e.g. one switch card, four switch cards, etc.). Switch cards 102 are oriented, positioned, disposed, located, etc., parallel to each other. Each switch card 102 includes one or more connectors, such as connectors 202 illustrated in FIGS. 2 and 3. For example, each switch card 102 may include ten connectors and each of the ten connectors (of a switch card 102) may be coupled to a respective connector (such as connector 206 illustrated in FIGS. 2 and 3) on line cards 106 and/or supervisor cards 410. Thus, switch cards 102 include a set of connectors that may couple switch cards 102 to line cards 106 and supervisor cards 410.

Network device 400 also includes a set of line cards 106 (e.g., eight line cards). Although eight line cards 106 are illustrated, other embodiments may use any number of line cards (e.g. twelve line cards, four line cards, etc.). Line cards 106 are generally oriented, positioned, disposed, located, etc., parallel to each other. Line cards 106 are also oriented, positioned, disposed, located, etc., orthogonal to switch cards 102. Each line card 106 also includes a set of connectors, such as connectors 206 illustrated in FIGS. 2 and 3. For example, each line card may include two connectors, and each of the two connectors may be coupled to one of switch cards 102. Line cards 106 may allow network device 400 to communicate data with other devices and/or networks. For example, each line card may include network modules (e.g., small form factor pluggable (SFP) modules, octal SFP (OSFP) modules, quad SFP (QSFP) modules, etc.), ports, etc., that may couple network device 400 to other devices and/or networks.

In one embodiment, line cards 106 may be Power Over Ethernet (POE) line cards. For example, line cards 106 may include ports or connectors (e.g., Ethernet ports) that allow line cards 106 to connect to POE devices (e.g., devices that receive or transmit power over Ethernet). POE line cards may generate (e.g., radiate) less heat than other types of line cards because the POE line cards may deliver power to other devices over Ethernet cables and the other devices may be located away from or separate from the POE line cards. Thus, the heat generated by delivering the power to the devices may not be located at or near the POE line cards, but may be located near the devices that are receiving power from the POE line cards. In some embodiments, the network device may be able to sufficiently cool the POE line cards, the switch cards 102, and power supplies 405 by drawing in air through the POE line cards. The air is then directed through switch cards 102 and power supplies 405. Because the POE line cards may not generate as much heat as other types of line cards, this allows the air that flows through the POE line cards to sufficiently cool switch cards 102 and power supplies 405.

Network device 400 further includes power supplies 405. Power supplies 405 may be modules, components, devices, etc., which generate and/or provide power (e.g., current, voltage, etc.) to network device 400 and/or components of network device 400. For example, power supplies 405 may provide power to one or more of line cards 106, supervisor cards 410, switch cards 102, etc. Power supplies 405 may be divided into two sets or groups. The first set of power supplies 405 (e.g., the five leftmost power supplies 405) may be located on the left side of network device 400 and the second set of power supplies 405 (e.g., the five rightmost power supplies 405) may be located on the right side of network device 400.

The network device also includes a set of supervisor cards 410 (e.g., two supervisor cards). Although two supervisor cards 410 are illustrated, other embodiments may use any number of supervisor cards (e.g. twelve line cards, four line cards, etc.). Supervisor cards 410 are generally oriented, positioned, disposed, located, etc., parallel to each other, and parallel to the line cards 106. Supervisor cards 410 are also oriented, positioned, disposed, located, etc., orthogonal to the switch cards 102. Each of supervisor cards 410 may include connectors to couple supervisor cards 410 to the PCBAs 420 and switch cards 102.

In one embodiment, network device 400 may include a control plane and a data plane. The data plane receives, processes, and forwards network data using various control plane data (e.g. packet forwarding, routing, switching, security, quality of service (QoS), and other network traffic processing information). For example, for each received packet of the network traffic, the data plane determines a destination address of that packet, determines the requisite information for that destination, and forwards the packet out the proper outgoing interface. In other embodiments, the control plane may perform functions related to quality of service, access control lists management (or other types of security), policy service, fan agent, light emitting diode agent, temperature sensor agent, database service, management service(s), processes to support networking protocol, routing protocols, and/or other network flow management applications.

In one embodiment, the control plane gathers the control plane data from different sources (e.g., locally stored configuration data, via a command line interface, or other management channel such as Simple Network Management Protocol (SNMP)) and configures the data plane using the control plane data. The control plane data may include information corresponding to a plurality of different classes of control plane traffic, such as routing protocol messages, routing table messages, routing decisions messages, route update messages, unresolved traffic messages, L2 protocol messages, link aggregation control protocol messages, link layer state updates messages (e.g., spanning tree messages), link state update messages (e.g., link aggregation control protocol messages for a link aggregation group, bidirectional forwarding detection messages, etc.), exception packets that cannot be dealt with in hardware (e.g., router alerts, transmission time interval messages, maximum transmission size exceeded messages, etc.), program messages (e.g., packets from a controller instructing the programming of a network element), messages for routing table misses, time control messages (e.g., precision time protocol messages), messages for packets marked as being of interest for snooping (e.g., access control list logging and port mirroring messages), messages used to collect traffic diagnostics, address resolution messages (ARP) requests and replies, neighbor solicitation requests and replies, general communication to the control plane of the networking device, etc.

In one embodiment, supervisor cards 410 may be part of the control plane. Supervisor cards 410 may include hardware (e.g., processors, memories, connectors, etc.), software, and/or firmware that allow supervisor cards 410 to perform various control plane functions, as discussed above. In another embodiment, switch cards 102 may also be part of the control plane. For example, switch cards 102 may be configured by the control plane to route network data (e.g., packets, frames, etc.) to different line cards 106 which may be coupled to switch cards 102 (as discussed above).

Network device 400 further includes busbar 415. Busbar 415 may be one or more metallic strips, bars, etc., that may be used for power distribution at a higher current or higher voltage. Busbar 415 may be coupled to switch cards 102, line cards 106, supervisor cards 410, and power supplies 405. Busbar 415 may receive power from one or more of the power supplies 405 (e.g., to the two sets of power supplies 405) and may provide power to one or more of switch cards 102, line cards 106, and supervisor cards 410. Switch cards 102, line cards 106, supervisor cards 410, and power supplies 405 may be coupled to busbar 415 via clips, prongs, or other types of appropriate connectors. In one embodiment, using busbar 415 allows the network device to provide power to components without distributing power via a printed circuit board. For example, if a printed circuit board were used to distribute power to switch cards 102, line cards 106, and supervisor cards 410, the printed circuit board may be larger and thicker than the printed circuit board assemblies (PCBAs) 420. This would increase the cost and complexity of network device 400. In addition, this would also decrease the amount of airflow through network device 400 because the larger printed circuit board may block some of the airflow. For example, a larger printed circuit board may block air from flowing through line cards 106, to switch cards 102 and the power supplies 405. Furthermore, because busbar 415 is used to distribute power to components of network device 400 (instead of a printed circuit board), a single printed circuit board may be divided into multiple smaller printed circuit boards, PCBAs 420. For example, a larger mid-plane PCBA may deliver the power the different components of the network device 400 (e.g., line cards 106, switch cards 102, supervisor cards 410, etc.). However, the mid-plane PCBA may obstruct airflow. Because busbar 415 may be located or positioned adjacent to the sides of the network device air may flow more easily through the center portion of the network device 400. This may also allow for better airflow through network device 400.

Figure 5:
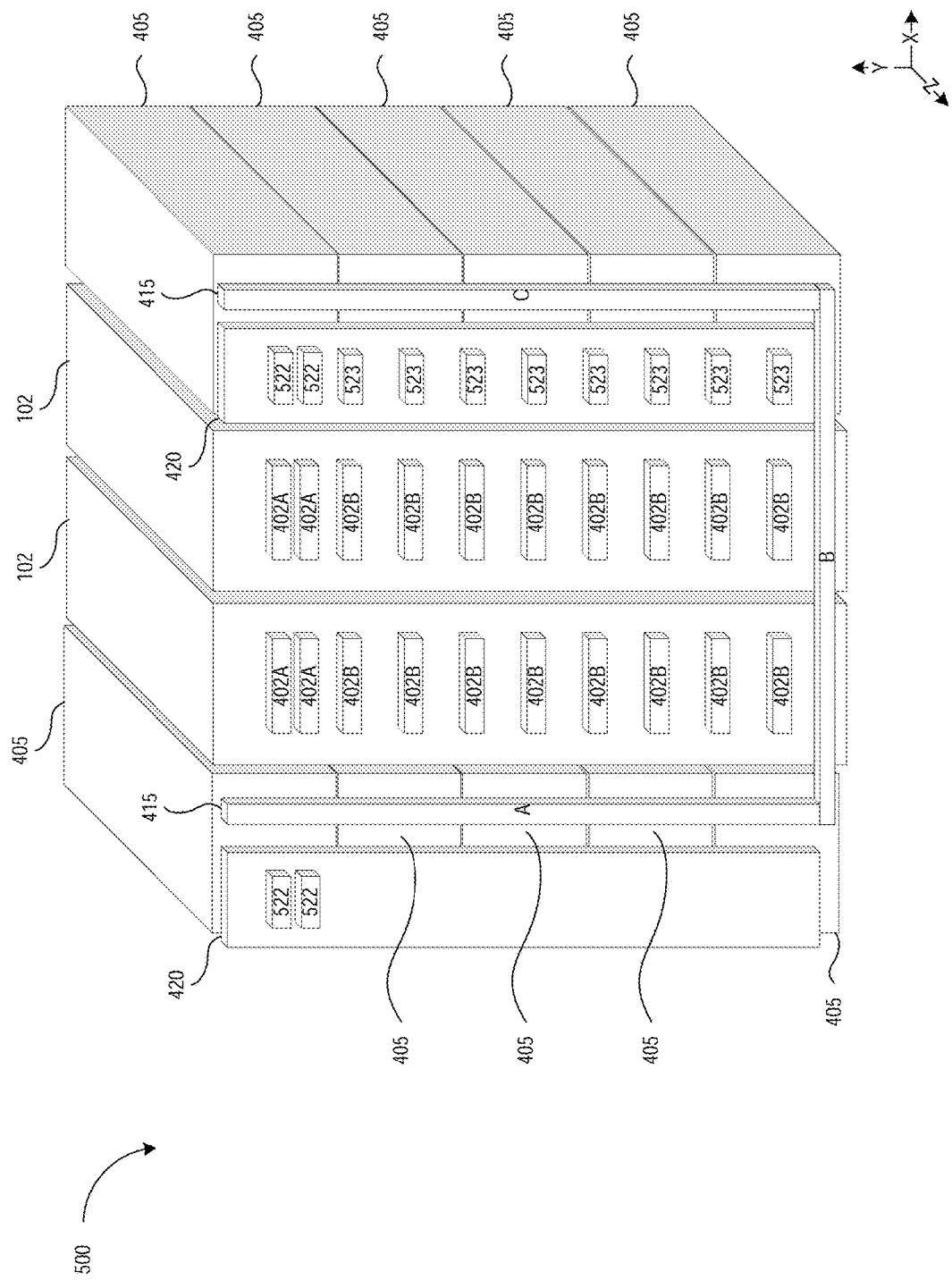
FIG. 5 is a diagram illustrating a perspective view of a portion of an example network device, in accordance with some embodiments of the present disclosure.

In one embodiment, busbar 415 may have a U-shape (e.g., as illustrated in FIG. 5). For example, the vertical portions of the U-shape (A and C) may be generally oriented, positioned, disposed, located, etc., on the left and right side of the network device 400 and the horizontal portion of the U-shape (B) may be oriented, positioned, disposed, located, etc., on the bottom of network device 400. Busbar 415 may include multiple bars and each of the bars may be formed as one continuous piece, or may be constructed from multiple pieces connected (e.g., soldered) together. In other embodiments different shapes of busbars and different numbers of busbars may be used. For example, the busbar may have an H-shape.

As illustrated in FIG. 4, switch cards 106 are generally oriented, positioned, disposed, located, etc., between leftmost power supplies 405 (e.g., the first set of power supplies 405) and rightmost power supplies 405 (e.g., the second set of power supplies 405). Switch cards 106 are also generally oriented, positioned, disposed, located, etc., such that the width of the line card runs along the Y-axis. Also as illustrated in FIG. 4, line cards 106 and supervisor cards 410 are generally oriented, positioned, disposed, located, etc., in front of switch cards 102, and power supplies 405.

Network device 400, in an embodiment, further includes two printed circuit board assemblies (PCBAs) 420. One PCBA 420 is generally oriented, positioned, disposed, located, etc., toward the left side of the network device 400 and the other PCBA 420 is generally oriented, positioned, disposed, located, etc., toward the right side of the network device 400. PCBAs 420 are also generally oriented, positioned, disposed, located, etc., between power supplies 405, and line cards 106 and supervisor cards 410. A PCBA may also be referred to as a PCB, a board, a circuit board, etc.

In one embodiment, PCBA 420 on the left side of network device 400 may be coupled to supervisor cards 410 and leftmost power supplies 405 (e.g., the first set of power supplies 405). PCBA 420 on the right side of network device 400 may be coupled supervisor cards 410, line cards 106, and rightmost power supplies 405 (e.g., the second set of power supplies 405).

In one embodiment, PCBAs 420 may be coupled to each other via supervisor cards 410. For example, each supervisor card 410 may be coupled to both PCBAs 420. Because supervisor cards 410 may be coupled to both of PCBAs 420, supervisor cards 410 may allow data (e.g., packets, messages, frames, or other information) to be communicated between PCBAs 420. For example, supervisor cards 410 may be a bridge, connection, etc., between two PCBAs 420.

In one embodiment, network device 400 may allow air to flow through the network device in the direction indicated by arrow 450 (see FIG. 4). Airflow from the front of network device 400 may directed through line cards 106 and/or supervisor cards 410. For example, the airflow (e.g., the moving or flowing air) may be directed through gaps between line cards 106 and/or supervisor cards 410. In another example, the air may flow through openings, channels, etc., within line cards 106 and/or supervisor cards 410. The airflow may be directed towards switch cards 102 through line cards 106 and/or supervisor cards 410. For example, the air may flow through the gaps between line cards 106 and/or switch cards 102 (or through openings, channels, etc., within the line cards 106 and/or switch cards 102) towards the back of the network device 400. The airflow may be directed towards power supplies 405 through line cards 106, supervisor cards 410, and/or busbar 415. For example, the air may flow through the gaps between line cards 106, switch cards 102, and/or busbar 415 (or through openings, channels, etc., within the line cards 106 and/or switch cards 102). The air may continue to flow through or past power supplies 405 (e.g., through openings, holes, channels, gaps, etc., in power supplies 405) towards the back of network device 400. This allows for a sufficient amount of air to flow through network device 400 to cool the components of network device 400. For example, this allows line cards 106, switch cards 102, and power supplies 405 to be cooled by the airflow.

In one embodiment, PCBAs 420 may be referred to as a midplane. Dividing the midplane into two separate PCBAs 420 may allow for better airflow through the network device 400. For example, because PCBAs 420 located on the sides of network device 400 (e.g., the left side and the right side), air may flow through the middle portion of network device 400. Although two PCBAs 420 are separate from each other, PCBAs 420 may still communicate data with each other because they are connected via supervisor cards 410.

In one embodiment, network device 400 (e.g., a housing of the network device 400) may have a height of ten rack units (RUs). A rack unit (RU) may be a unit of measurement that is based on a standard rack specification as defined by the Electronic Industries Alliance (EIA). For example, a RU may be 1.75 inches (i.e., 1 and ¾ inches) or 44.45 millimeters (mm) as defined by the EIA-310 standard. Thus, network device 400 may have a height of approximately 17.5 inches or 444.5 mm. In another embodiment, each line card 106 has a height of one RU. For example, each line card 106 may be 1.75 inches or 44.5 mm high. In a further embodiment, each supervisor card 460 may have a height of one half (e.g., ½) of a rack unit (RU). For example, each supervisor card may be 0.875 inches or 22.25 mm high.

As discussed above, network device 400 may be installed on or attached to racks (e.g., rack mounts, rack frames, etc.). Generally, racks have a fixed and/or standardized size. For example, a rack may have a certain height. The height of the racks may limit the number of network devices that may be mounted to the racks. For example, if a rack has a height of 20 feet, and each network device has a height of 2 feet, then 10 network devices may be installed in the rack. It may be desirable to install more network devices on a rack to reduce the number of racks used to house the network devices. For example, installing more devices on a rack may reduce the number of racks that are used, which may reduce the space used by the racks (e.g., space within a data center). Thus, it may be useful to be able to install more network devices in existing racks.

The examples, implementations, and embodiments described herein allow for a more compact, smaller, shorter, etc., network device 400. For example, network device 400 (which has a height of 10 RU in one embodiment) may be shorter than traditional network devices (which may have heights of 13 RU). One or more of the various embodiments described herein may allow network device 400 to have a reduced or more compact size (e.g., a smaller height). For example, the orthogonal arrangement of line cards 106 and switch cards 102 allows for better airflow through network device 400 while allowing line cards 106 and switch cards 102 to be interconnected with each other. Orienting, placing, positioning, locating, etc., power supplies 405 in-line with line cards 106 (e.g., behind the line cards 106) allows network device 400 to be shorter in height because the power supplies are no longer located above or below line cards 106 as in traditional switches. In addition, orienting, placing, positioning, locating, etc., power supplies 405 on the sides (e.g., left and right sides) of network device 400 allows for better airflow through the middle portion of network device 400. Separating the mid-plane into PCBAs 420 also allows for better airflow through network device 400. Orienting, placing, positioning, locating, etc., busbar 415 between line cards 106 and switch cards 102 and power supplies 405 allows power (from power supplies 405) to be distributed to all of the components of the network device (e.g., the line cards 106, the switch cards 102, the supervisor cards 410, etc.) from a single central location.

In one embodiment, network device 400 may include eight line cards 106, two supervisor cards 410, two switch cards 106 and power supplies 405 within the height of 10 RU. This may be a significant reduction in height when compared to traditional network devices that may have a height of 13 RU or even 12 RU. The reduced height and/or the increased compactness (when compared with traditional network devices) of network device 400 allows for more network devices to be installed within a rack which may reduce the amount of spaced used by the racks (e.g., the amount of space used in a data center). In addition, the in-line positioning or location of line cards 106, switch cards 102, supervisor cards 410, and power supplies 405 allow for sufficient cooling of network device 400, even with the reduced height and/or increased compactness.

FIG. 5 is a diagram illustrating a perspective view of portion 500 of example network device 400 (illustrated in FIG. 4), in accordance with some embodiments of the present disclosure. Portion 500 of network device 400 may be referred to as the back or rear portion of network device 400. Portion 500 includes PCBAs 420, busbar 415, power supplies 405 and switch cards 102.

As discussed above, switch cards 102 may provide switching paths or routing paths. These switching paths or routing paths couple and/or connect ingress and egress ports of switch chip 104 through the switch fabric in some embodiments. This allows different line cards 106 to communicate data with each other. As illustrated in FIG. 5, switch cards 102 are generally oriented, positioned, disposed, located, etc., parallel to each other. The switch cards 102 are also oriented, positioned, disposed, located, etc., between two groups or set of power supplies 405. Each of switch cards 102 includes connectors 402A and 402B. Connectors 402A and 402B may be orthogonal connectors, similar to connectors 202 illustrated in FIGS. 2 and 3. Connectors 402A may be coupled to corresponding orthogonal connectors on supervisor cards (e.g., similar to connector 206 illustrated in FIGS. 2 and 3). Connectors 402B may be coupled to corresponding orthogonal connectors (e.g., connector 206) on line cards 106.

Also as discussed above, power supplies 405 may be modules, components, devices, etc., which generate and/or provide power (e.g., current, voltage, etc.) to network device 400 and/or components of network device 400. Power supplies 405 may be divided into two sets or groups. The first set of power supplies 405 (e.g., the five leftmost power supplies 405) may be located on the left side of network device 400 and the second set of power supplies 405 (e.g., the five rightmost power supplies 405) may be located on the right side of network device 400.

Busbar 415 may be one or more metallic strips, bars, etc., that may be used for higher current or higher voltage power distribution, as discussed above. Busbar 415 may receive power from one or more power supplies 405 and may provide the power to one or more of switch cards 102, line cards 106, and supervisor cards 410. Busbar 415 includes three portions, portion A, portion B, and portion C. Portions A and C are oriented generally vertically and portion B is generally oriented horizontally.

Two PCBAs 420 may allow supervisor cards 410 to communicate data with line cards 106 and power supplies 405. For example, supervisor card 410 can communicate with power supplies 405 on either side of network device 400 via connectors 626. This may allow supervisor card 410 to control the operation of power supplies 405 on either side of network device 400. The left PCBA 420 includes connectors 522 which may be coupled to corresponding connectors on the supervisor cards 410. The right PCBA 420 includes connectors 522 and connectors 523. The connectors 522 of right PCBA 420 may be coupled to corresponding connectors on the supervisor cords 410. The connectors 523 may be coupled to corresponding connectors on the line cards 106. The connectors 522 and 523 may allow the supervisor cards to communicate data (e.g., control plane data) with line cards 106.

Figure 6:
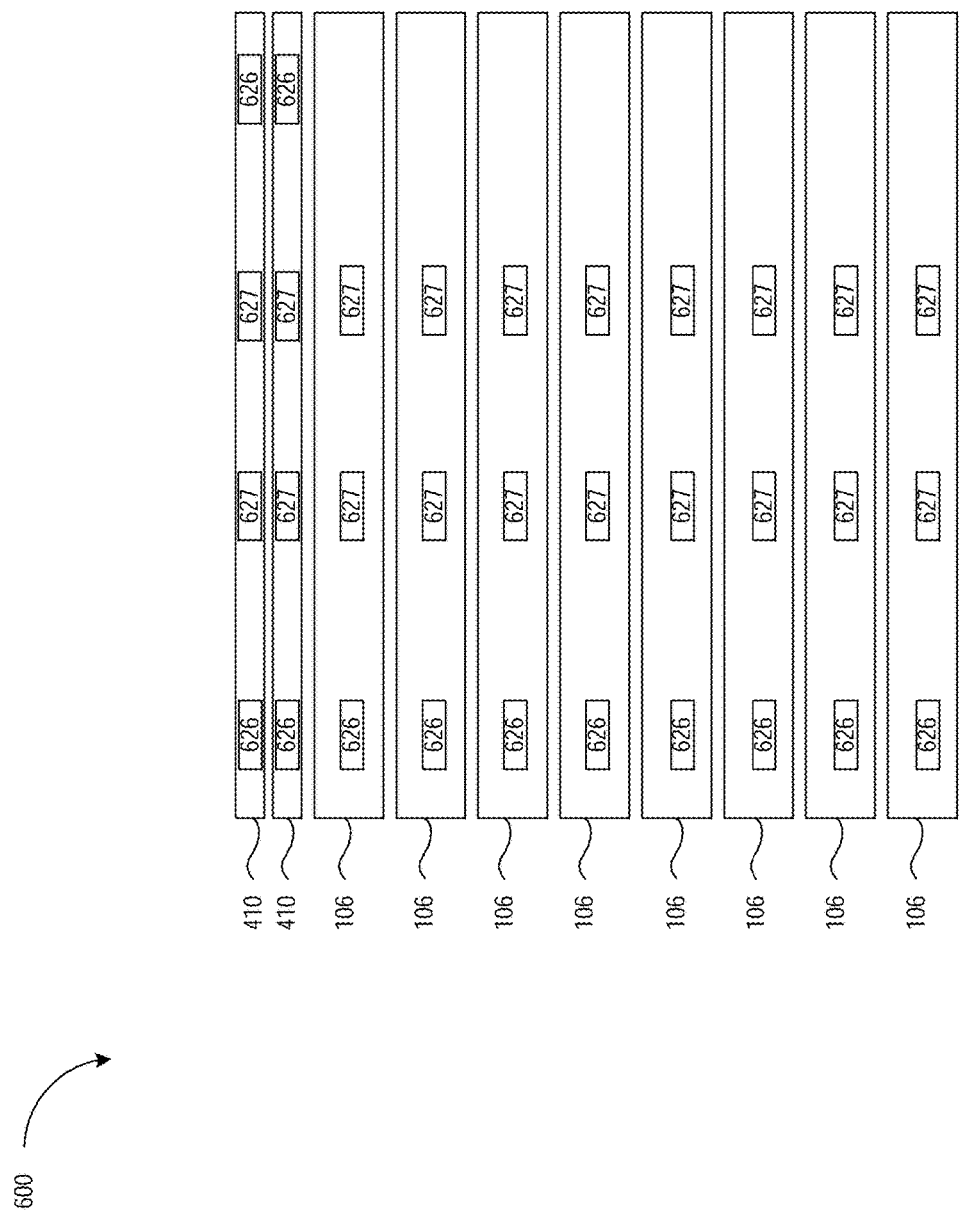
FIG. 6 is a diagram illustrating a back view of a portion of an example network device, in accordance with some embodiments of the present disclosure.

FIG. 6 is a diagram illustrating a back view of portion 600 of example network device 400 (illustrated in FIG. 4), in accordance with some embodiments of the present disclosure. Portion 600 of network device 400 may be referred to as the front or forward portion of the network device 400. The portion 600 includes supervisor cards 410 and line cards 106.

As discussed above, supervisor cards 410 may be part of the control plane of network device 400 and may communicate data (e.g., control plane information, configuration information, etc.) to configure, manage, setup, adjust, modify, etc., other components of network device 400. For example, supervisor cards 410 may control the operation of power supplies 405. In another example, supervisor cards 410 may configure how the line cards may communicate data with each other or with other devices. Supervisor cards 410 include connectors 626 and 627. The connectors 626 may couple the supervisor cards 410 to the PCBAs 420 via connectors 522 illustrated in FIG. 5. Connectors 627 may couple supervisor cards 410 to switch cards 102 via connectors 420A illustrated in FIG. 5. Connectors 627 may be orthogonal connectors, similar to connector 206 illustrated in FIG. 2.

As discussed above, line cards 106 may allow network device 400 to communicate data with other devices and/or networks. For example, line cards 106 may include ports, modules, etc., that may be coupled to other network devices and/or networks. On In one embodiment, line cards 106 may be POE line cards. Line cards 106 include connectors 626 and connectors 627. Connectors 626 may couple line cards 106 to PCBAs 420 via connectors 523 illustrated in FIG. 5. Connectors 627 may couple line cards 106 to switch cards 102 via connectors 420B illustrated in FIG. 5. Connectors 627 may be orthogonal connectors, similar to connector 206 illustrated in FIG. 2.

Figure 7:
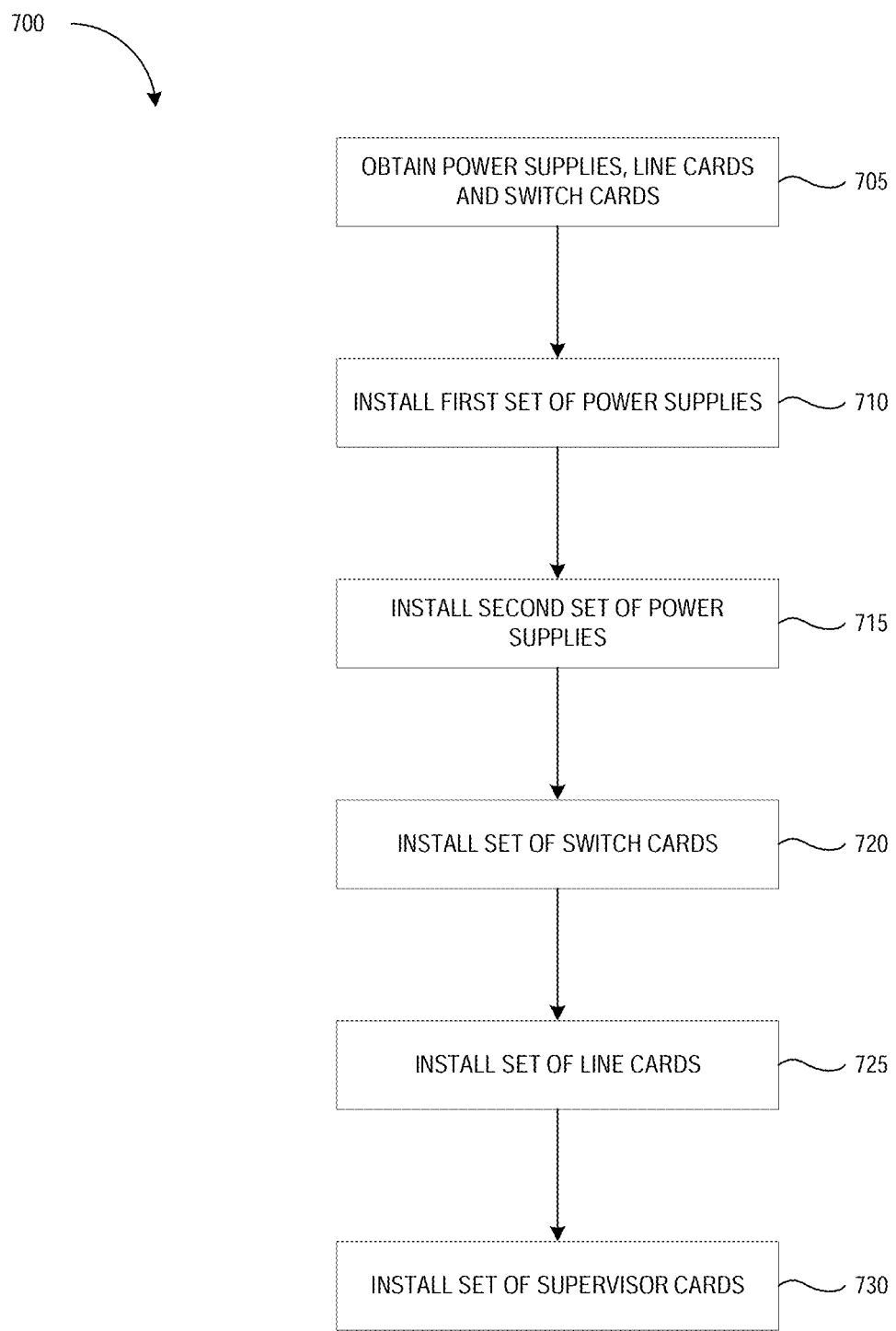
FIG. 7 is a flow diagram of a method of assembling or manufacturing a network switch device, which can be practiced with embodiments described herein.

FIG. 7 is a flow diagram of method 700 of assembling or manufacturing a network switch device, which may be practiced with embodiments described herein. It should be appreciated that the actions of method 700 in FIG. 7 can be performed in differing orders, groupings, or subsets than shown in FIG. 7, for various purposes or user preferences. Method 700 begins at block 705 a first set of power supplies, a second set of power supplies, a set of line cards, and a set of switch cards are obtained. A set of supervisor cards may also be obtained at block 705 in some embodiments. At block 710, a first set of power supplies is installed in the housing of a network device. For example, the first set of power supplies may be installed on a left side of a housing of a network device. The first set of power supplies may be coupled to a busbar which may receive power from the first set of power supplies. At block 715, a second set of power supplies is installed in the housing. For example, the second set of power supplies may be installed on a right side of a housing of a network device. The second set of power supplies may be coupled to the busbar which may receive power from the second set of power supplies.

At block 720, a set of switch cards may be installed in the housing of the network device. For example, the set of switch cards may be installed, located, positioned, etc., between the first set of power supplies and the second set of power supplies. The set of switch cards may also be coupled to the busbar to receive power from the busbar. The set of switch cards may be oriented such that the switch cards are parallel with each other. The set of switch cards may also be coupled to the busbar to receive power from the busbar. At block 725, the set of line cards may be installed within the housing of the network device. The set of line cards may be installed, located, positioned, etc., in front of the power supplies and the switch cards. The set of line cards may also be oriented such that the line cards are parallel with each other and orthogonal to the switch cards. At block 730, the set of supervisor cards may be installed in the housing of the network device. The supervisor of line cards may be installed, located, positioned, etc., in front of the power supplies and the switch cards. The set of supervisor cards may also be oriented such that the supervisor cards are parallel with each other and orthogonal to the switch cards.

As discussed above, the actions of method 700 in FIG. 7 can be performed in differing orders. For example, the power supplies, line cards, switch cards, and/or supervisor cards may be installed in the network device in any order (e.g., any component may be installed first, followed by another component, followed by another component, etc.).

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A network device, comprising:
    a housing;
    a set of switch cards, mounted within the housing and comprising a first set of connectors;
    a set of line cards comprising a second set of connectors, wherein:
        the set of line cards are oriented orthogonally to the set of switch cards; and
        the second set of connectors is coupled to the first set of connectors to couple the set of switch cards to the set of line cards;
    a first set of power supplies disposed along a left side of the housing and disposed in-line with the set of line cards;
    a second set of power supplies disposed along a right side of the housing and disposed in-line with the set of line cards; and
    a midplane including a first circuit board assembly disposed between the set of line cards and the first set of power supplies and a second circuit board assembly disposed between the set of line cards and the second set of power supplies, the midplane including no circuit board assembly disposed in a center portion of the housing between the first circuit board assembly and second circuit board assembly.

2. The network device of claim 1, further comprising a busbar to provide power to the set of line cards, wherein the busbar is coupled to the first set of power supplies and the second set of power supplies, and wherein the busbar includes a left portion disposed along the left side of the housing and disposed between the first set of power supplies and the set of line cards, and the busbar further includes a right portion disposed along the right side of the housing and disposed between the second set of power supplies and the set of line cards, wherein the busbar and midplane allow air to flow through the set of line cards to the set of switch cards, the first set of power supplies, and the second set of power supplies.

3. The network device of claim 2, wherein:
    the busbar is a U-shaped busbar and comprises the left portion of the busbar coupled to the first set of power supplies, the right portion of the busbar coupled to the second set of power supplies, and a middle portion of the busbar coupled to the left portion and the right portion; and
    the middle portion of the busbar is disposed at a bottom of the housing.

4. The network device of claim 1, wherein:
the set of switch cards is positioned between the first set of power supplies and the second set of power supplies; and
the set of switch cards is disposed in-line with the set of line cards.

5. The network device of claim 1, wherein:
the set of line cards is positioned in front of the set of switch cards, the first set of power supplies, and the second set of power supplies; and
an orthogonal orientation of the set of switch cards and the set of line cards allows air to flow through the set of line cards to the set of switch cards, the first set of power supplies, and the second set of power supplies.

6. The network device of claim 1, further comprising:
a set of supervisor cards coupled to the set of switch cards, wherein:
the set of supervisor cards is oriented orthogonally to the set of switch cards; and
the set of supervisor cards is oriented parallel with the set of line cards.

7. The network device of claim 6, wherein:
the set of supervisor cards is positioned in front of the set of switch cards, the first set of power supplies, and the second set of power supplies; and
air flows through the set of supervisor cards to the set of switch cards, the first set of power supplies, and the second set of power supplies.

8. The network device of claim 6, wherein:
the first circuit board assembly is coupled to the first set of power supplies and the set of supervisor cards; and
the second circuit board assembly is coupled to the second set of power supplies and the set of supervisor cards, and wherein a space between the first circuit board and the second circuit board allows air to flow.

9. The network device of claim 6, wherein the set of supervisor cards is coupled to a busbar.

10. The network device of claim 1, wherein the busbar comprises:
a left portion coupled to the first set of power supplies;
a right portion coupled to the second set of power supplies; and
a middle portion coupled to the left portion and the right portion, the middle portion is disposed at a middle of the housing and the busbar disposed between the first set of power supplies and the second set of power supplies, and the set of line cards.

11. The network device of claim 1, wherein airflow from a front of the network device is directed through the set of line cards towards the set of switch cards.

12. The network device of claim 1, wherein airflow from a front of the network device is directed through the set of line cards and through a busbar towards the first set of power supplies and the second set of power supplies.

13. The network device of claim 1, wherein:
the housing has a height of ten rack units (RU);
the set of line cards comprises eight line cards; and
the set of switch cards comprises two switch cards; and
the network device further comprises two supervisor cards.

14. The network device of claim 1, wherein the set of line cards comprises a Power Over Ethernet (POE) line card.

15. A method of manufacturing a network device, the method comprising:
obtaining a first set of power supplies, a second set of power supplies, a set of line cards, and a set of switch cards;
installing, within a housing, the first set of power supplies along a left side of the housing;
installing, within the housing, the second set of power supplies along a right side of the housing;
installing, within the housing, the set of switch cards between the first set of power supplies and the second set of power supplies;
installing, within the housing, the set of line cards in-line with the first set of power supplies, the second set of power supplies, and the set of switch cards, wherein:
the set of line cards are oriented orthogonally to the set of switch cards; and
the set of line cards are oriented parallel with each other,
installing, within the housing, a first circuit board assembly of a midplane disposed between the set of line cards and the first set of power supplies; and
installing, within the housing, a second circuit board assembly of the midplane disposed between the set of line cards and the second set of power supplies, the midplane including no circuit board assembly in a center portion of the housing between the first circuit board assembly and second circuit board assembly.

16. The method of claim 15, further comprising:
installing, within the housing, a set of supervisor cards in front of the first set of power supplies, the second set of power supplies, and the set of switch cards, wherein:
the set of supervisor cards are oriented orthogonally to the set of switch cards;
the set of supervisor cards are oriented parallel with each other and the set of line cards.

17. The method of claim 15, further comprising:
installing, within the housing, a left portion of a busbar along the left side of the housing between the set of line cards and the first set of power supplies;
installing, within the housing, a right portion of the busbar along the right side of the housing between the set of line cards and the second set of power supplies; and
wherein installing the first set of power supplies comprises coupling the first set of power supplies to the left portion of the busbar;
wherein installing the second set of power supplies comprises coupling the second set of power supplies to the right portion of the busbar;
wherein installing the set of switch cards comprises coupling the set of switch cards to the busbar; and
wherein installing the set of line cards comprises coupling the set of line cards to the busbar.

18. A network device, comprising:
a housing;
a set of switch cards, mounted within the housing and comprising a first set of connectors;
a set of line cards comprising a second set of connectors, wherein:
the set of line cards are oriented orthogonally to the set of switch cards; and
the second set of connectors is coupled to the first set of connectors to couple the set of switch cards to the set of line cards;
a first set of power supplies disposed along a left side of the housing and disposed in-line with the set of line cards;
a second set of power supplies disposed along a right side of the housing and disposed in-line with the set of line cards;

a busbar coupled to the set of line cards, the set of switch cards, the first set of power supplies, and the second set of power supplies; and a midplane including a first circuit board assembly disposed between the set of line cards and the first set of power supplies and a second circuit board assembly disposed between the set of line card and the second set of power supplies, the midplane including no circuit board assembly disposed in a center portion of the housing between the first circuit board assembly and second circuit board assembly, the midplane and busbar allowing air to flow from a front of the housing through the set of line cards and center portion of the housing to the set of switch cards, first set of power supplies and second set of power supplies.

19. The network device of claim 18, wherein the busbar has a left portion disposed along the left side of the housing and disposed between the first set of power supplies and the set of line cards, and the busbar further includes a right portion disposed along the right side of the housing and disposed between the second set of power supplies and the set of line cards.

20. The network device of claim 18, wherein:

the set of switch cards is positioned between the first set of power supplies and the second set of power supplies;

the set of switch cards is disposed in-line with the set of line cards the set of line cards is positioned in front of the set of switch cards, the first set of power supplies, and the second set of power supplies; and an orthogonal orientation of the set of switch cards and the set of line cards allows air to flow through the set of line cards to the set of switch cards, the first set of power supplies, and the second set of power supplies.

* * * * *